United States Patent [19]
Dove et al.

[11] Patent Number: 5,999,861
[45] Date of Patent: Dec. 7, 1999

[54] METHOD AND APPARATUS FOR COMPUTER-AIDED DESIGN OF DIFFERENT-SIZED RF MODULAR HYBRID CIRCUITS

[75] Inventors: Lewis R. Dove, Monument, Colo.; Daniel J. Miller, San Francisco, Calif.

[73] Assignee: Hewlett Packard Company, Palo Alto, Calif.

[21] Appl. No.: 08/872,285

[22] Filed: Jun. 10, 1997

Related U.S. Application Data

[63] Continuation of application No. 08/617,975, Mar. 15, 1996, abandoned, which is a continuation of application No. 08/283,138, Jul. 29, 1994, abandoned.

[51] Int. Cl.[6] ............................. G06F 19/00; G06G 7/66
[52] U.S. Cl. ........................................ 700/182; 700/186
[58] Field of Search ..................... 364/474.24, 474.04, 364/474.28; 395/80

[56] References Cited

U.S. PATENT DOCUMENTS

| | | | |
|---|---|---|---|
| 4,638,442 | 1/1987 | Bryant et al. | 364/489 |
| 4,864,514 | 9/1989 | Yamanaka et al. | 364/489 |
| 4,933,860 | 6/1990 | Liu | 364/490 |
| 5,297,053 | 3/1994 | Pease et al. | 364/474.24 |
| 5,353,234 | 10/1994 | Takigami | 364/489 |
| 5,404,309 | 4/1995 | Yamamoto et al. | 364/489 |

*Primary Examiner*—William Grant
*Assistant Examiner*—Victoria Robinson
*Attorney, Agent, or Firm*—Patrick J. Murphy

[57] ABSTRACT

A method and apparatus is presented for designing an RF modular hybrid circuit assembly. The apparatus comprises a rule-based control mechanism, a graphical user interface and a library of RF hybrid elements including model front- and back-sides, and input/output instances. The method comprises the steps of initializing standardized front- and back-plane models, adding input/output instances along the perimeter of the back-plane, designing the hybrid circuit on the front-plane and combining the two planes to arrive at an RF modular hybrid layout design. A data library of RF hybrid elements is provided to facilitate rapid prototyping. The final design is then sent concurrently to a photo-plotter and a laser subsystem for printing the thick-film and cutting the PTHs respectively.

4 Claims, 11 Drawing Sheets

METHOD AND APPARATUS FOR COMPUTER-AIDED DESIGN OF DIFFERENT-SIZED RF MODULAR HYBRID CIRCUITS

This is a continuation of application Ser. No. 08/617,975 filed on Mar. 15, 1996, now abandoned, which is a continuation of application Ser. No. 08/283,138 filed on Jul. 29, 1994, now abandoned.

FIELD OF THE INVENTION

The present invention relates generally to computer-aided design and more particularly to a method for the computer-aided design and layout of a family of different-sized, demountable microwave and high-speed digital circuit assemblies.

BACKGROUND AND SUMMARY OF THE INVENTION

Computer-aided design (CAD) systems provide the engineer with the capability to design and test products via computer simulation. Many CAD systems are geared towards generic circuit simulation with little or no support for system-specific design. Generic CAD systems often contain hundreds of functions in order to be general-purpose. The engineer using this type of system must acquire a working knowledge of most of these functions in order to use the tool. This leaves the engineer in the unenviable position of first learning the intricacies of the tool, which can take weeks or months, before any development can begin.

A second disadvantage of the generic CAD system, stemming again from the generality, is the fact that the system does not constrain the engineer to use the tool in a way that will yield rapid prototype designs. This is due in large part to effort creating system-specific libraries of elements, rather than designing the actual circuit to be prototyped. The effort put forth creating libraries increases as the complexity of the prototype increases.

The present invention provides a method and apparatus for the computer-aided design of RF modular hybrid packages. The method comprises the steps of initializing standardized front- and back-plane models, adding input/output instances along the perimeter of the back-plane, designing the hybrid circuit on the front-plane and combining the two planes to arrive at an RF modular hybrid layout design. A data library of RF hybrid elements is provided to facilitate rapid prototyping.

DETAILED DESCRIPTION OF THE PREFERRED EMBODIMENT

Broadly, the present invention provides a method and apparatus for the computer-aided design and layout of RF modular hybrid circuit assemblies. The method and apparatus comprise a rule-based control mechanism, a graphical user interface and a library of hybrid elements including model front- and backsides, and input/output instances.

The RF modular hybrid circuit assemblies which are designed using the present method and apparatus comprise a family of high performance, low cost, demountable thick film assemblies which can be easily designed, re-worked and manufactured. The packaging technology used for these assemblies results in a lower per-unit product cost, as well as lower overall system costs. Development cycles have been significantly shortened in comparison to fully custom microcircuits without sacrificing customizable freedom. This is due in part to the introduction of standardized elements and a demountable mechanical assembly.

Figure 1:
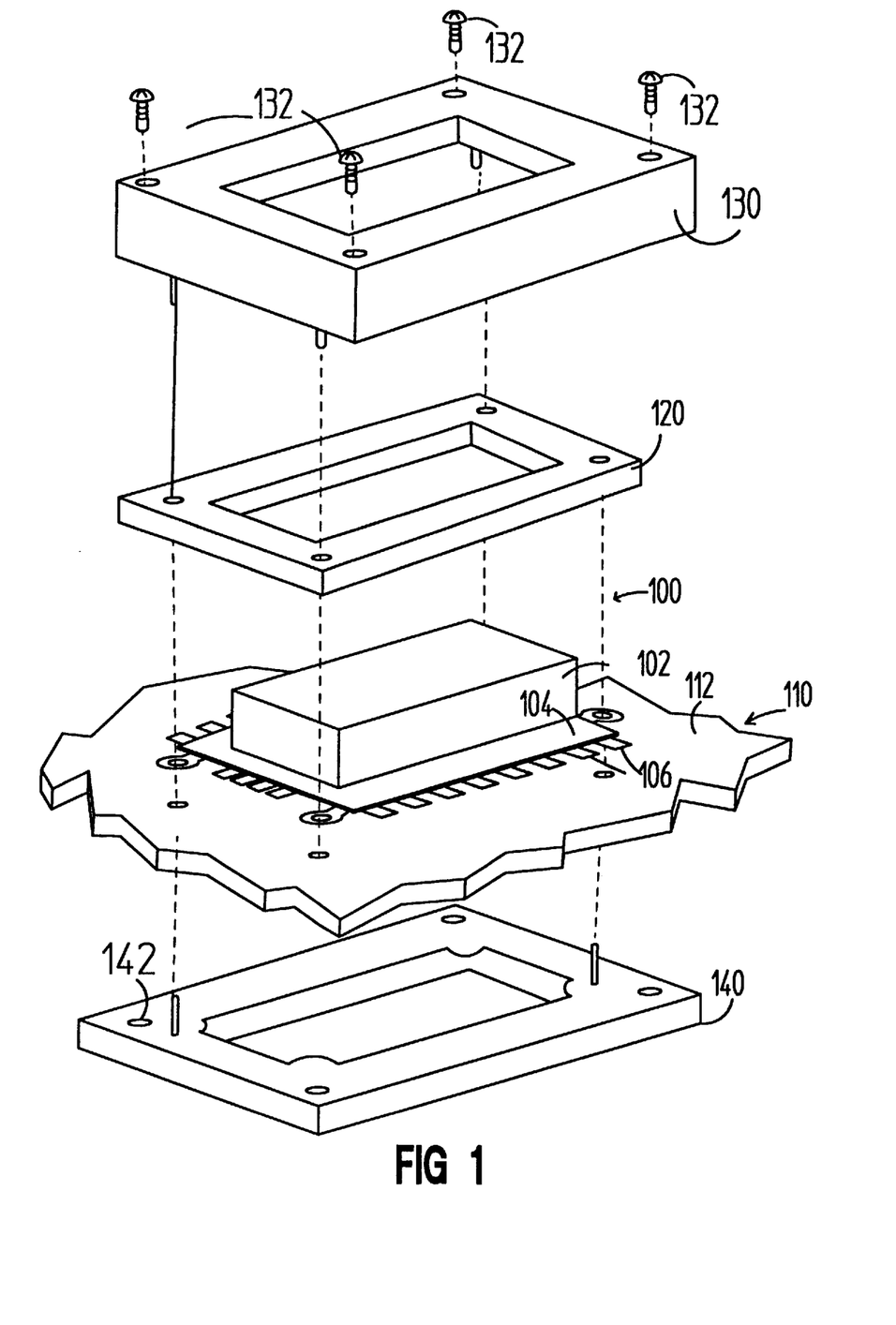
FIG. 1 shows an exploded view a representative modular hybrid assembly which can be designed and modeled using the present method.

FIG. 1 shows an exploded view a representative modular hybrid assembly which can be designed and modeled using the present method. A high frequency RF modular hybrid circuit 100 is comprised of a customized microcircuit affixed to a customizable region (not shown) and is encased within an isolation lid 102, as well known in the art, which can be made of Kovar for example. The lid 102 offers mechanical protection to the customized microcircuit, as well as electrical isolation and gross or hermetic sealing. A leadframe has conductive leads 106 protruding horizontally from the bottom of a high frequency substrate 104 which maximizes the bandwidth of the interconnection. The leadframe is typically comprised of an alloy with a thermal coefficient matched to the coefficient of the assembly. The conductive leads 106 are placed in frictional contact with a printed circuit board 110 which has conductive coating 112 laminated and patterned upon the surface of the board 110. This planar launch embodiment has the advantages of controlled-impedance transitions and easy mounting/demounting of the high frequency circuit 100. In a preferred embodiment, the modular hybrid provides up to 8 GHz bandwidth transitions with only −20 db return loss.

The high frequency substrate 104 can be made of a ceramic composite such as alumina, for example. The conductive coating 112 laminated and patterned on the surface of the printed circuit board 110 should be gold-plated thick enough to satisfy signal integrity requirements, yet thin enough to avoid inter-metallic formation when components, other than the high frequency circuit 100, are soldered directly upon the board 110. In a preferred embodiment, the gold-plating is a 5 microinch flash of gold which is placed across the entire board 110. This eliminates the need for selective gold plating which would increase production costs and manufacturing time.

In a preferred embodiment, the high frequency circuit 100 is held securably in place upon the printed circuit board 110 by a mechanical clamping structure which is comprised of an elastomeric member 120, a top clamp 130, a stiffener 140 and clamping screws 132. Briefly, this clamping structure provides reliable electrical and mechanical interconnections between the circuit 100 and the printed circuit board 110. One advantage of this mechanical clamping structure is the ease with which package disassembly can be effected. This facilitates rework and field replacement since use of a clamping structure obviates conventional soldering and gluing techniques typically used to attach assemblies to a motherboard.

As indicated above, the clamping structure is formed of an elastomeric member 120, a top clamp 130, a stiffener 140, and clamping screws 132. This mechanical structure provides support for one part of the controlled-impedance transition for the modular hybrid. An important feature of the present invention is the controlled-impedance interconnection between high frequency signal paths on the circuit 100 and the motherboard 110. With the clamping structure in place over the circuit assembly 100, a coplanar waveguide transmission line is formed where two ground traces are defined on either side of a high frequency RF signal trace on the leadframe.

Proper electrical contact is ensured by using the top clamp 130 to compress the elastomeric member 120 against the outer ends of the plurality of conductors 106. This compression forces the circuit assembly 100 into frictional, and therefore electrical, contact with the motherboard 110. The clamping structure is held in place by attachment to the stiffener 140 which is on an opposed side of the motherboard 110. In addition to holding the clamping structure and circuit assembly 100 securely in place, the stiffener 140 maintains the planarity of the motherboard 110. The stiffener 140 must be strong enough to provide the needed support while offering a slim profile due to limited space requirements. In the preferred embodiment, the stiffener 140 is made of high-strength carbon steel and is available from California Fineblanking Corporation, 5803 Engineer Drive, Huntington Beach, Calif. 92649.

A minimum contact pressure is required around the entire perimeter of the circuit assembly 100 for the life of the product. This requirement is satisfied by a glass-filled plastic clamp, which also facilitates electrical isolation and mechanical reliability. In the preferred embodiment, the top clamp 130 is made of polycarbonate plastic with a 40% glass fill and is available from Camtex Corporation, 3075 Osgood Court, Fremont, Calif. 94539. This clamp composite will ensure that no electrical paths exist directly above the modular hybrid assembly that would degrade the assembly isolation. Further, a glass-filled plastic is sufficiently strong enough to resist bowing and has a long-term resistance to creep.

The elastomeric member 120 should have beneficial thermal and mechanical properties while resisting system environmental problems, such as moisture and chemical agents. For these reasons, the elastomeric member 120 may be made of silicone. In a preferred embodiment, the elastomeric member 120 is 747U Silicone, available from Rubber Development Incorporated, 426 Perrymont Avenue, San Jose, Calif. 95125. Additionally, enough force must be applied to the plurality of conductors 106, the substrate 104 and the motherboard 110 in order to prevent relative displacement between these elements. If the elastomeric member 120, together with the remaining elements of the clamping structure, did not provide adequate force, mechanical shock and vibrations could cause failure of the leadframe solder joints or create signal distortions within the coplanar waveguide transmission line or both.

Another important feature of the present invention is the scalability of the modular hybrid circuit assembly which can be effected without adversely affecting assembly performance. Electrical performance reliability is maintained regardless of assembly size. Preferred embodiments of the high frequency substrate have x-y dimensions of 1.50"×1.00" and 3.65"×3.65". Other sizes, e.g., 1.50"×2.50" and 2.00"×3.00", are possible. Scalability of the modular hybrid assembly is accomplished due in part to the standardized conducting elements and clamping structures. Standardization provides quick turn around on new designs; the assembly designer need only be concerned with the customizable circuit and customizable input/output paths. Hence, scalability of the RF modular hybrid assembly is easily accommodated.

Figure 2:
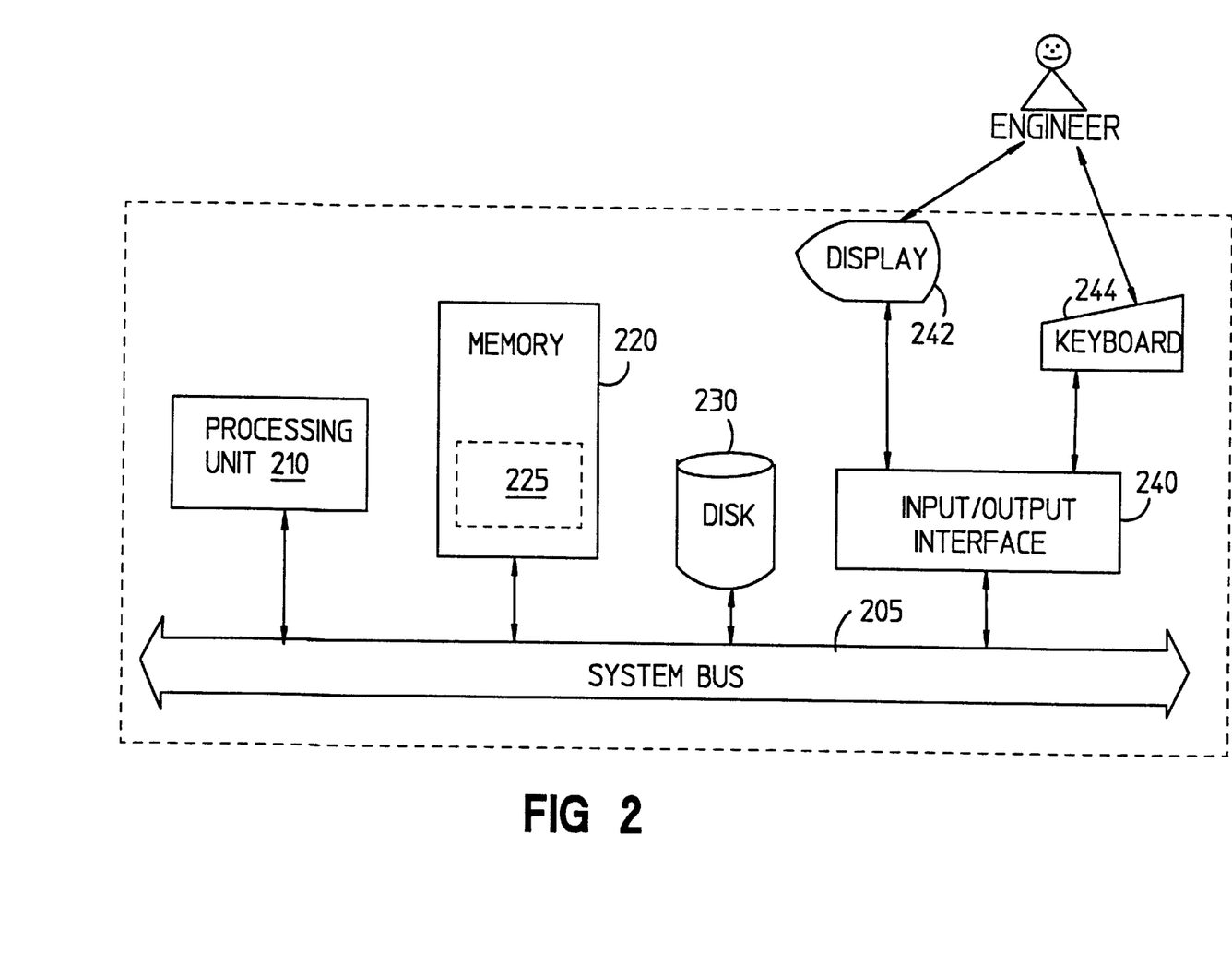
FIG. 2 shows a block diagram of a general purpose digital computer system which incorporates the present method.

FIG. 2 shows a block diagram of a general purpose digital computer system which incorporates the present method. A processing unit 210 is connected to system bus 205. The system bus 205 facilitates communications between the processing unit 210 and memory 220, a data storage disk 230 and an input/output interface device 240. The memory stores the software of the present invention as well as all data collected and generated by the present invention. An area 225 within the memory 220 is set aside for storage of the present method which is described more fully below. The disk includes an area (not shown) in which resides a library of RF hybrid circuit elements. The input/output interface device 240 controls data communications between the bus 205 and a display 242 and a keyboard 244. The display 242 and keyboard 244 provide a means for an engineer to interact with the present method which is located in the area 225 of memory 220.

Figure 3:
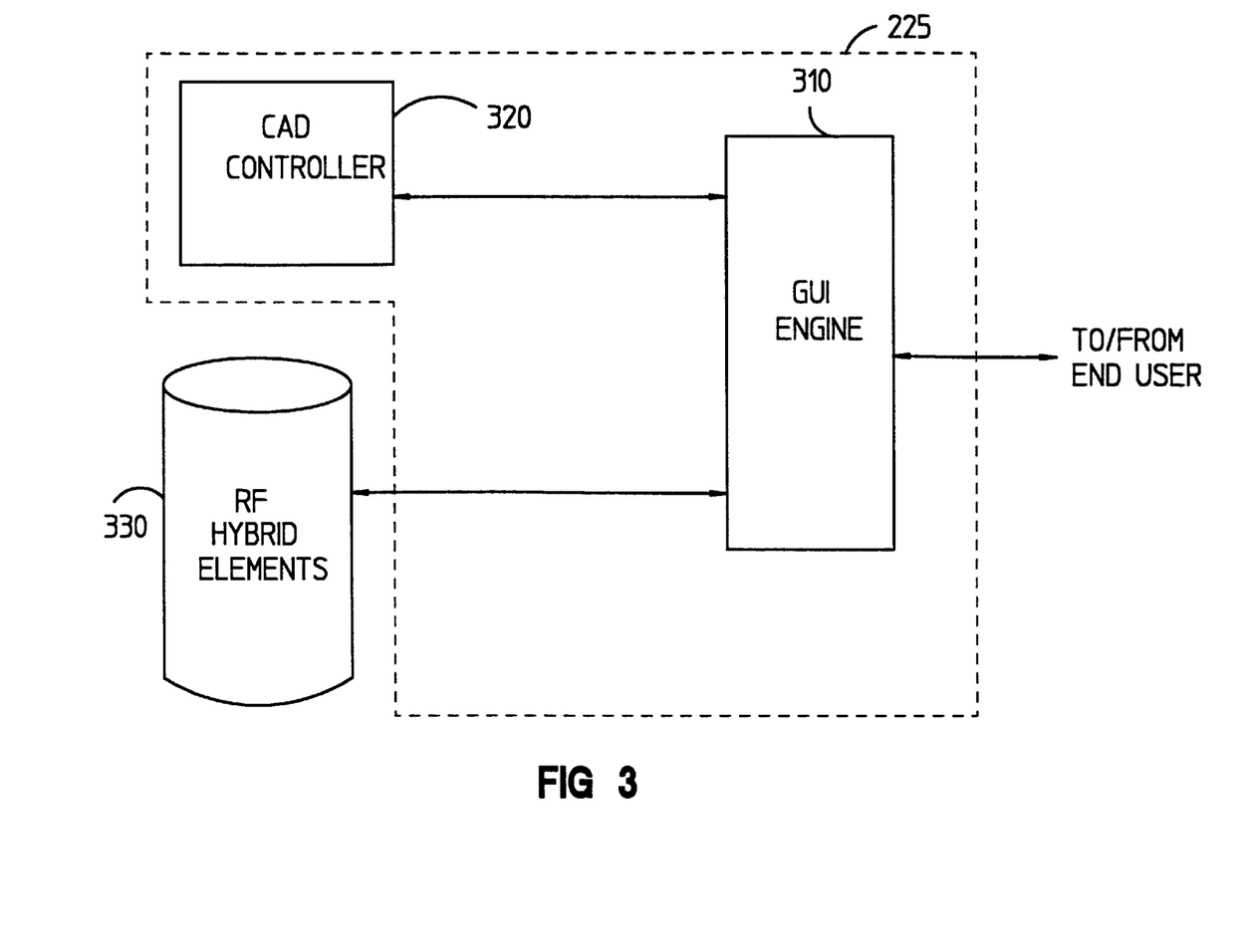
FIG. 3 shows a more detailed block diagram of the present invention.

FIG. 3 shows a more detailed block diagram of the present invention as incorporated into area 225 of memory 220. A graphical user interface (GUI) engine 310 is disposed between a computer-aided design (CAD) controller 320 and the engineer. The CAD controller 320 provides a protocol for managing the design of the RF modular hybrid circuit. The protocol follows the method as described below with respect to FIGS. 4a–c. Essentially, the protocol directs the engineer down the path towards a final design, facilitating the design by controlling each step the engineer may take. The GUI engine 310 controls the communications between the engineer and a data library of RF hybrid elements 330. In a preferred embodiment, the GUI engine 310 and CAD controller 320 are found in Hewlett-Packard's Engineering Graphic System (EGS), a CAD tool available from Hewlett-Packard Company, 3000 Hanover Street, Palo Alto, Calif. A data library of RF hybrid elements 330 including, among other things, model front- and back-sides, input/output instances and printed through holes, is accessible to the engineer through the GUI engine 310. The elements are stored in both a text and a graphic format. The data library 330 may reside in the data storage disk (item 230 in FIG. 2) or may be in a separate disk altogether.

Figure 4A:
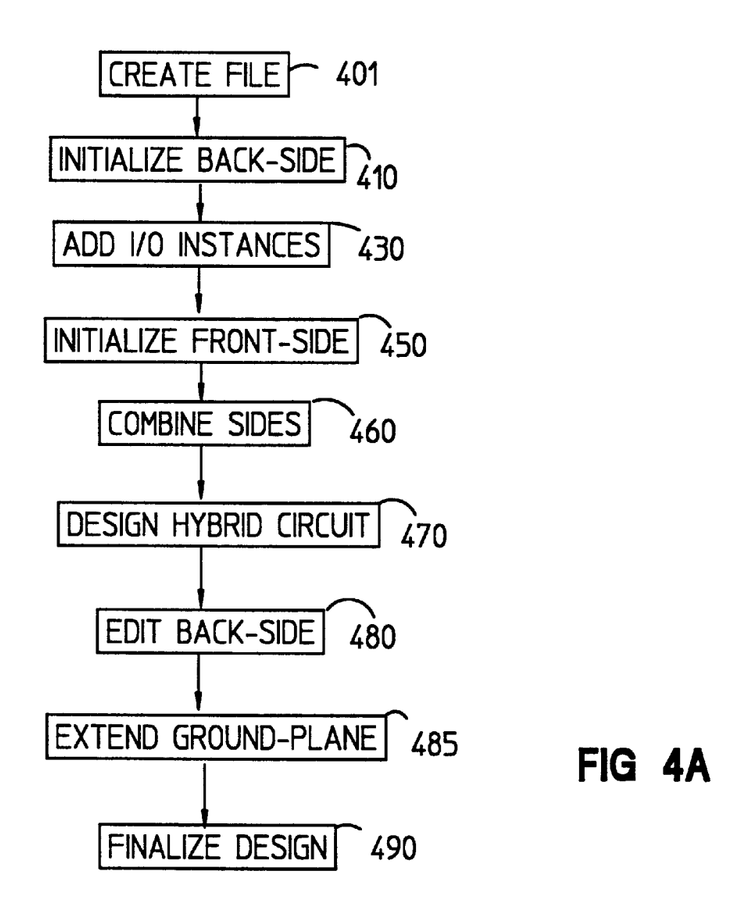
FIGS. 4a–c shows a flow diagram of the present method.
Figure 5:
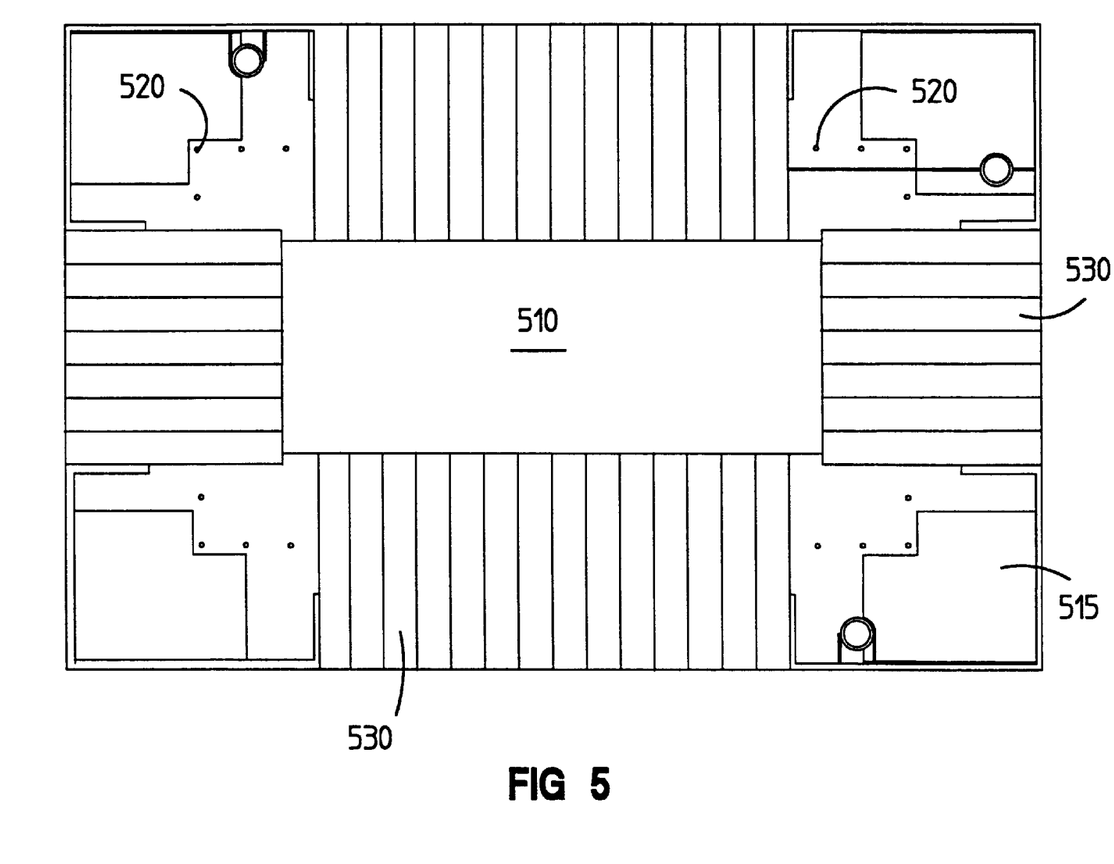
FIG. 5 shows an instance of a 1.00"×1.50" standardized back-side footprint.

FIG. 4a shows a flow diagram of the present method. Generally, the method permits an engineer to create an RF modular hybrid circuit model using a library of hybrid elements. After creating a drawing file (block 401) which will hold the RF modular hybrid model, block 210 initiates the back-plane of the modular hybrid model. The standardized back-plane footprint is placed at the origin (0,0). There are several standardized back-side footprints available from the data library of RF hybrid elements (item 330 in FIG. 3) including: 1.00"×1.50"; 1.55"×2.55"; and 3.65"×3.65". Other sized back-side footprints can be made available by simply adding the new elements to the data library. Refer to FIG. 5 which shows an instance of a 1.00"×1.50" standardized back-side footprint. The view presented in FIG. 5 is a view of the thick film back-side as it would appear when looking through the substrate from the topside. FIG. 5 includes thick film layers 8 and 9 which are each platinum, palladium and silver (PtPdAg) composite metal prints. Layer 9 (item 510) is the print to be used for a PtPdAg ground plane and to provide the paste for printed through holes (PTHs). Layer 8 (item 515) is used to provide a double print of PtPdAg in those areas that get soldered to the lead frame. Other thick film layers shown in the back-side instance include (1) layer 82, which shows the location of the PTHs 520 used to connect the lid to the ground plane; (2) layer 92, which is the substrate outline; and (3) layer 94, which are the rectangles 530 located along the periphery of the back-side to which the various I/O launches are added.

Figure 6:
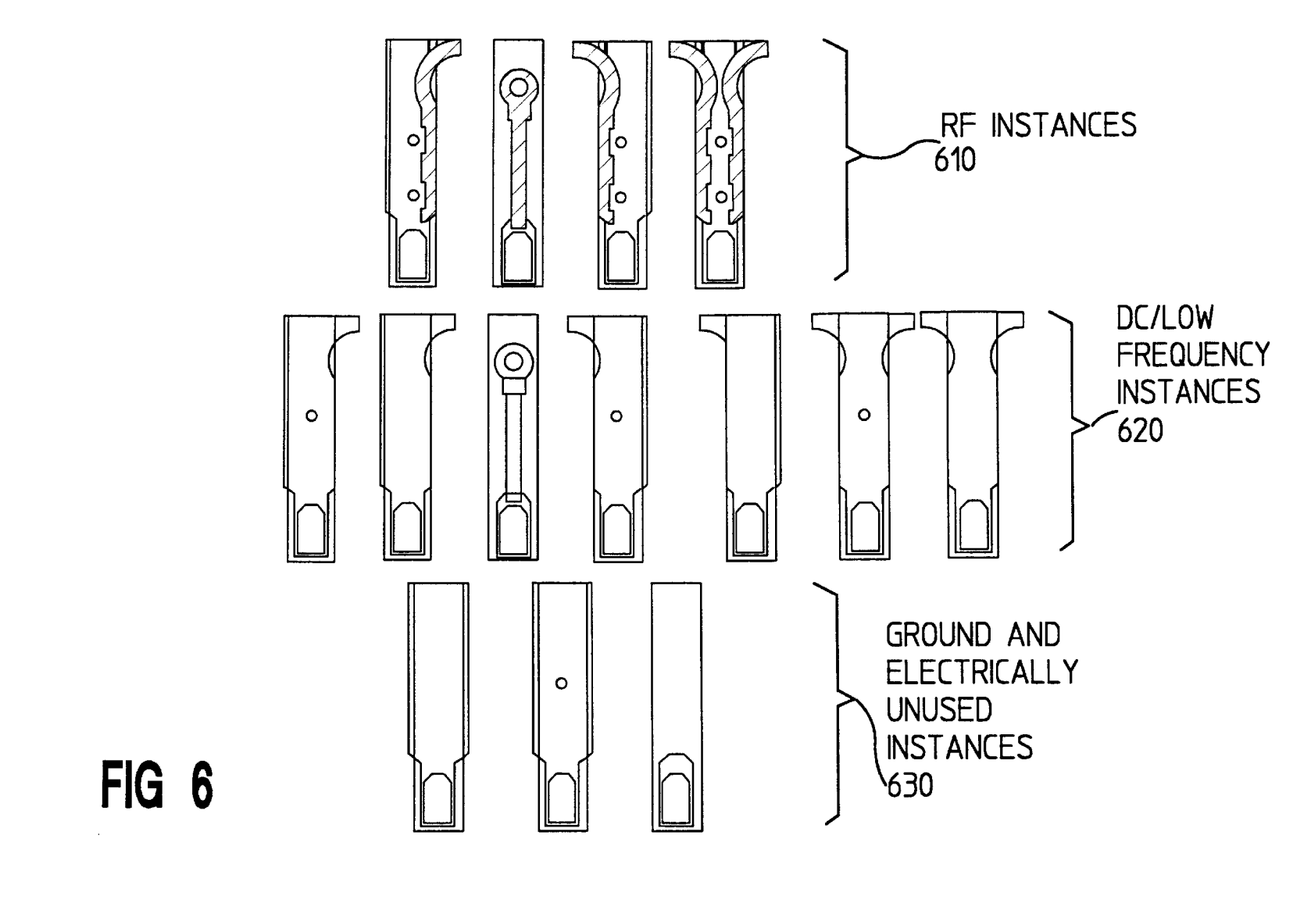
FIG. 6 shows the various I/O instances that are available.

Block 430 places input/output (I/O) instances along the perimeter of the back-plane created by block 410. Refer to FIG. 6 which shows the various I/O instances that are available. Other I/O instances can be made available by adding new I/O instances to the data library. Available I/O instances include RF signal and ground 610; DC/low frequency signal and ground 620; and ground and electrically "unused" instances 630. Note that an I/O instance must be added to each of the rectangles along the back-side. The unused instance has been created so that solder pads are present to attach a lead to an I/O that is electrically unused.

The shape of the RF and DC/low frequency signals and ground are the same. The two primary differences are: (1) the RF signal and grounds use a gold (Au) print (thick film layer 7) and (2) the RF grounds have two PTHs. The Au print is used in order to form the critical portion of the coplanar waveguide transmission line that is formed by using an RF signal I/O next to the properly countered RF ground I/Os. Generally, an Au print has much lower loss than a PtPdAg print and the width of an Au print is more easily controlled. The Au print is indicated in FIG. 6 by hatch marks. PTHs are used alongside the RF grounds to couple the grounds to the top-side grounded lid seal ring (discussed more fully below).

Figure 4B:
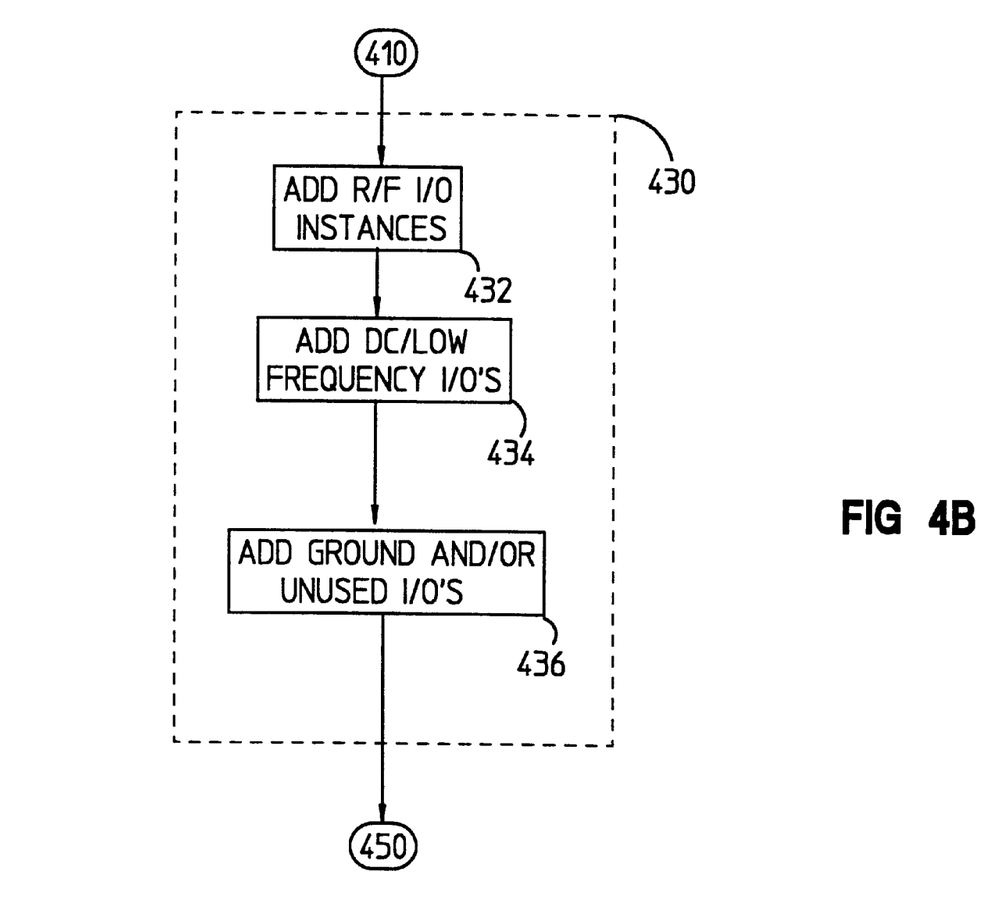

FIG. 4b shows an expanded view of block 430. Block 432 adds RF signal and ground I/O instances; block 434 adds DC/low frequency signal and ground I/O instances; and block 436 adds ground and/or unused I/O instances. One of the features of the present RF modular hybrid circuits is that fact that I/Os that are placed along the hybrid's periphery are fully customizable. Any number of RF signal and ground I/Os, DC/low frequency signal and ground I/Os, and ground/ unused instances can be placed anywhere, and in any order, along the periphery (i.e., the rectangles 530). FIG. 4b is only illustrative since the order in which these I/O instances are added is interchangeable.

Figure 7:
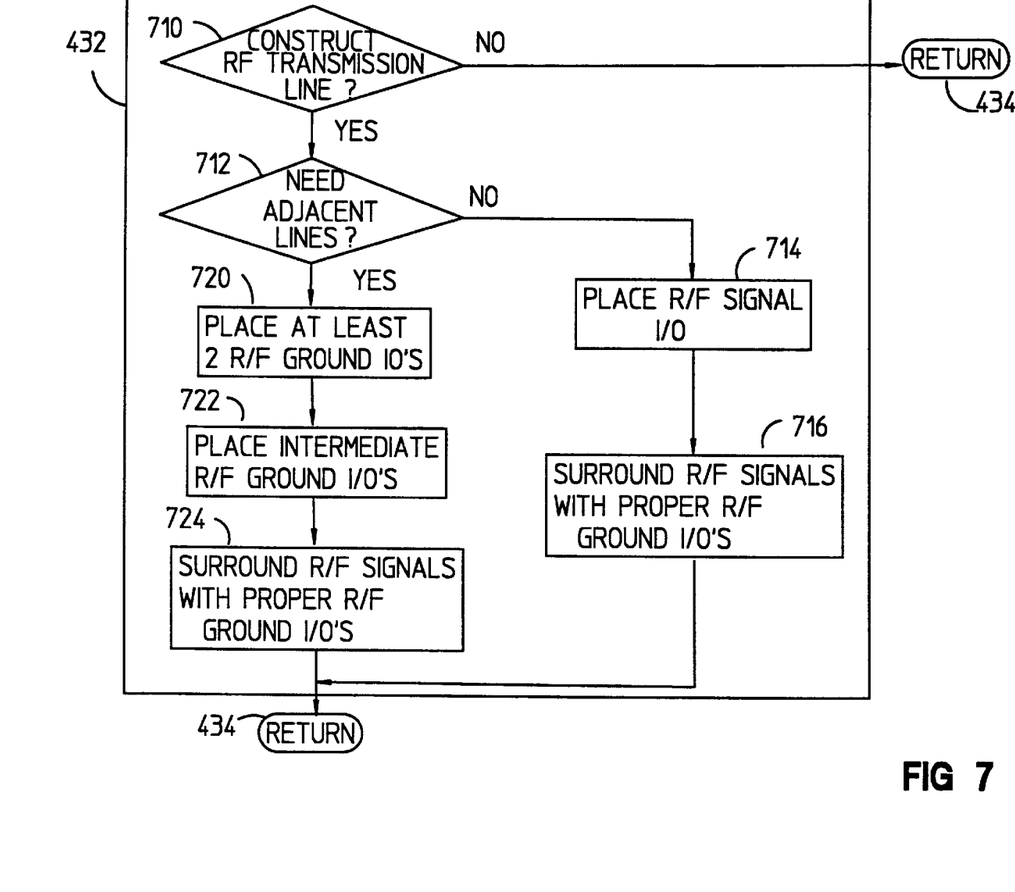
FIG. 7 shows an expanded view of block 432 in FIG. 4.
Figure 8:
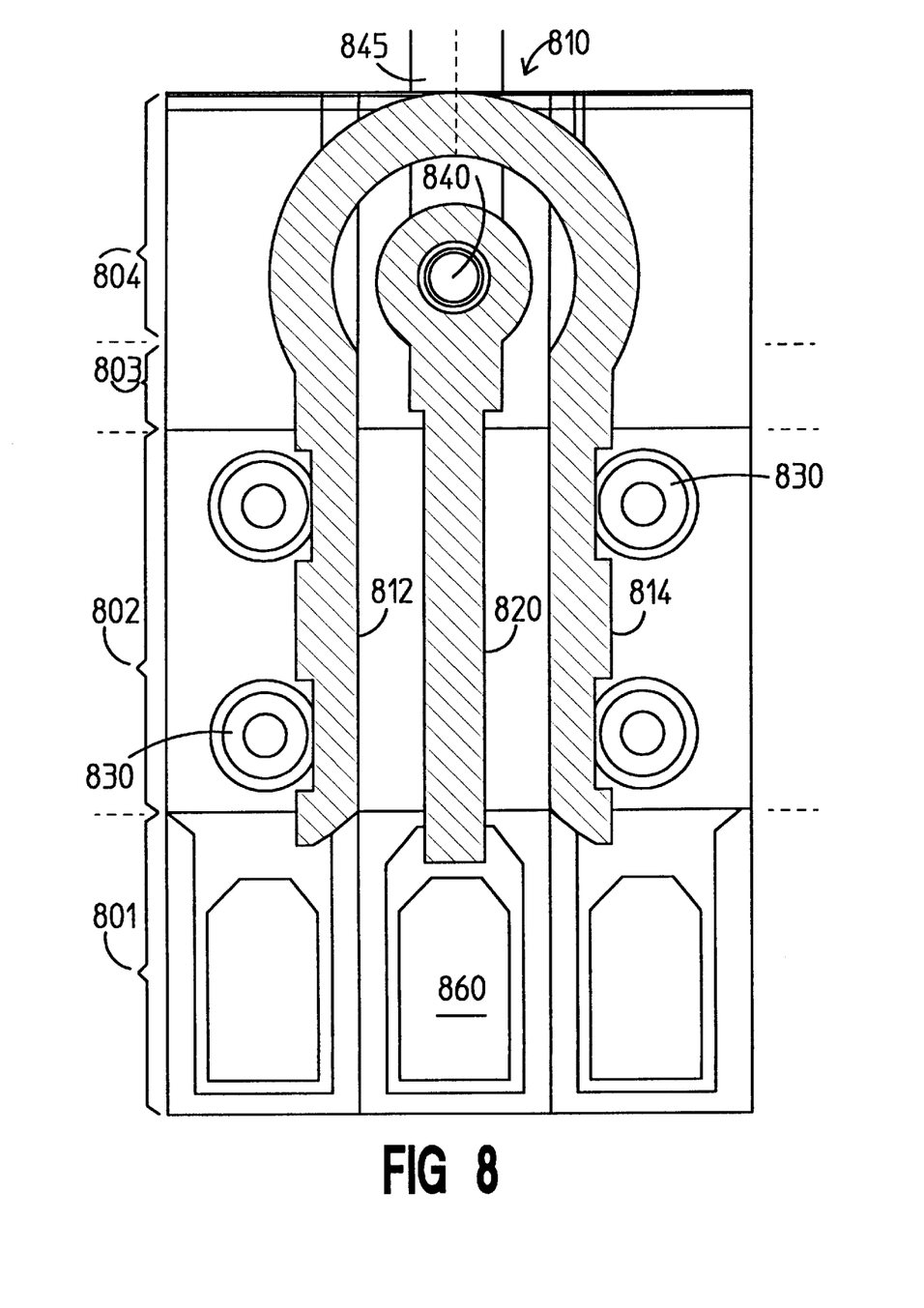
FIG. 8 shows a properly contoured RF transmission line.

Referring now to FIG. 7 which shows an expanded view of block 432, an RF transmission line is constructed by placing the proper RF ground I/O instances on either side of an RF signal I/O instance. Decisional block 710 determines whether an RF transmission line needs to be constructed. If not, control is passed to block 434 (i.e., add DC/low frequency I/O instances). If it is determined that an RF transmission line is to be constructed, control is passed to decisional block 712 which determines whether adjacent RF transmission lines are to be constructed. Block 714 receives control if only one RF transmission line is to be constructed. Block 714 places an RF signal I/O instance onto one of the rectangles (item 530 in FIG. 5) and then passes control to block 716. To construct an RF transmission line, the RF signal I/O must be surrounded by RF ground I/Os to form the proper contour for a compensated coplanar waveguide. FIG. 8 shows a properly contoured RF transmission line and will be discussed more fully below.

If decisional block 712 determines that adjacent RF transmission lines are to be constructed, then control is passed to block 720 which places at least two RF signal I/O traces on either side of an intermediate RF ground lead (item 722). Block 724 then places RF ground I/Os on the outer rectangles to form the proper contour for each coplanar waveguide. After the adjacent RF transmission lines are formed, control is returned, via block 434, to the flow diagram at block 430 in FIG. 4a (item 434 in FIG. 4b).

As mentioned above, FIG. 8 shows an RF transmission line which is to be placed on the back-side of the high frequency substrate for a thick-film embodiment of the modular hybrid. A signal trace 820 is substantially encased by a ground pattern 810, creating a coplanar waveguide. The geometries of the signal trace 820 and ground pattern 810 are specified to maintain the characteristic impedance when the traces are compressed between the substrate and the printed circuit board.

FIG. 8 can be viewed as an aggregation of four transitions. In the first transition 801, the signal trace 820 comprises the beginning of an elongated section that begins at a leadframe attachment pad 860. The second transition 802, in which the signal trace 820 continues as an elongated section, is disposed under the grounded isolation lid which is attached on the top-side of the substrate. In the third transition 803, the signal trace 820, which is a now a stub length, can be widened since this transition 803 is no longer disposed beneath the isolation lid and, hence, there is less capacitive coupling. The fourth transition 804 begins where the signal trace 820 becomes circular to accommodate the signal printed through hole (PTH) 840.

The ground pattern 810 approximates the signal trace 820. Through the first three transitions 801, 802, 803 the ground pattern 810 comprises two elongated sections on either side of and at a relative distance from the signal trace 820. This is followed by an arc-shaped portion in the third transition 803 which has the same center point as the circular portion of the signal trace 820 while maintaining the relative distance.

In a preferred embodiment, the signal trace 820 is 18 mils wide and is positioned 19 mils from each ground trace 812, 814. The signal 820 and ground 812, 814 traces are effected by a gold overlap on the platinum-palladium-silver metallization, which provides a ±2 mils line width tolerance during manufacturing. Gold, by itself, can be used instead, as well as a PtPdAg metallization.

As mentioned above, the signal trace 820 begins at the leadframe input 860 and terminates at a signal PTH 840. The signal trace 820 is necked down from the leadframe input 860 to compensate for capacitive effects of the grounded isolation lid which is disposed on the topside of the substrate. The signal PTH 840 electrically connects the signal trace 820, on the back of the substrate, to the microstrip transmission line 845 on the top of the substrate.

Four grounded printed through holes (PTHs) 830 are positioned along the ground traces 812, 814, tying these traces to the grounded lid seal ring on the top of the substrate. These grounded PTHs 830 prevent signal leakage through the substrate edge and mark a transition from the coplanar waveguide to a grounded coplanar waveguide which exists under the isolation lid. Four PTHs are used because connecting the coplanar waveguide ground to the lid seal ring ground with a low inductance, low resistance path is critical to maintain good RF electrical performance.

An RF input reaches the high frequency circuit (not shown) affixed to the top of the substrate via the signal trace 820, or coplanar waveguide, and microstrip transmission line 845. A feature of the present invention is that the various interconnections (e.g., from the leadframe attachment 860 to the signal trace 820; and from the signal trace 820 to the signal PTH 845) all have a characteristic impedance of approximately 50 ohms.

Figure 9:
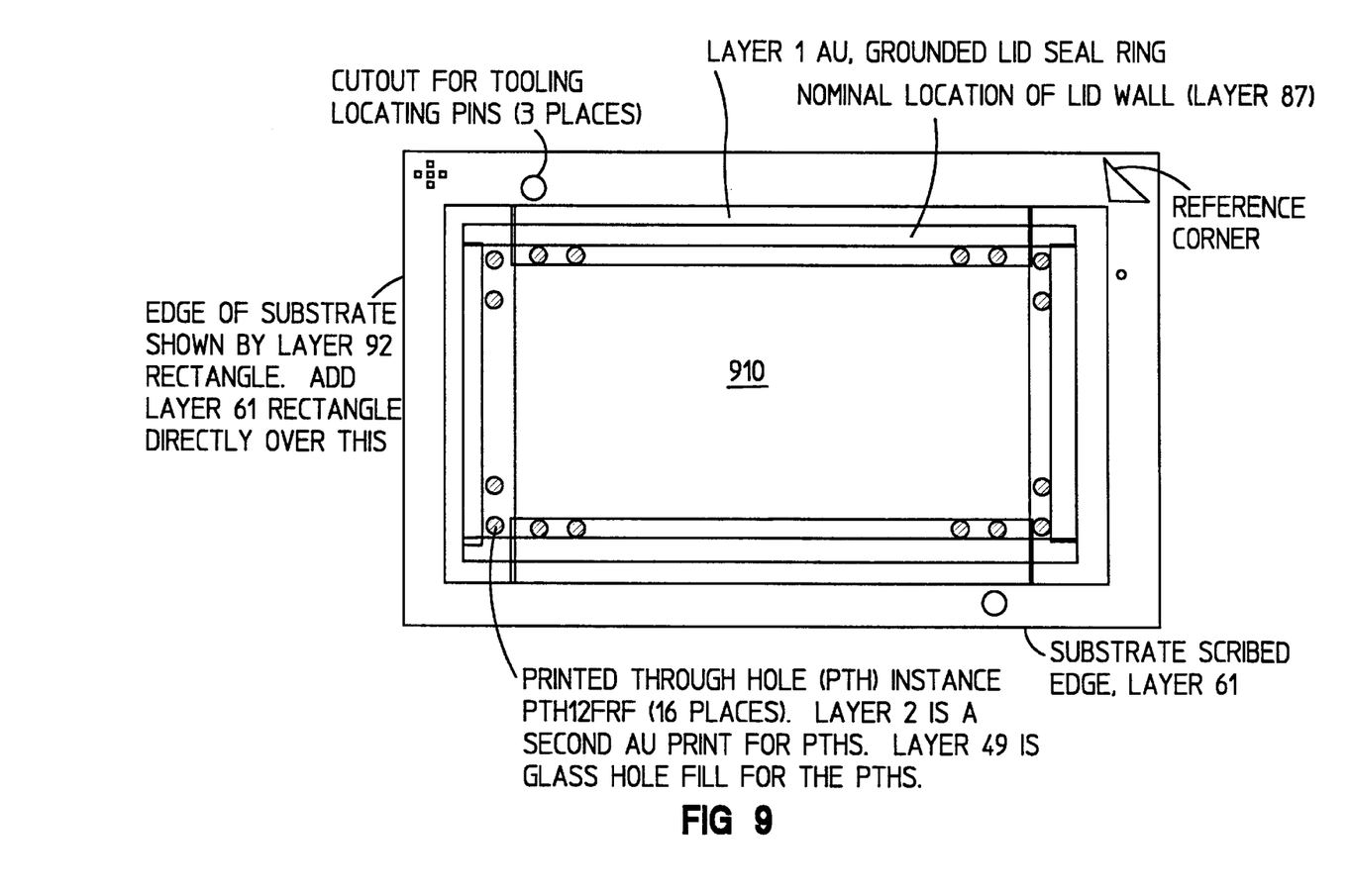
FIG. 9 shows a representative front-side footprint.

Returning to FIG. 4a, after the I/O instances are added to the backside, block 450 then initiates the front-side of the modular hybrid. Refer to FIG. 9 which shows a representative front-side. A customizable region 910 is located in the center of the front-side; it is upon this customizable region 910 that a hybrid circuit can be fabricated. Once the standardized footprint for the front-side is created, block 460 then combines the two sides, back and front, into one drawing model. This merge facilitates the identification of printed-through hole (PTH) location, for example.

After the two planes are merged into one drawing, the hybrid circuit can be laid out (block 470) on the customizable region of the front-side of the assembly. The customizable region can accommodate a variety of components such as thick-film, thin-film and co-fired ceramic circuitry. For example, thick-film components can be fabricated directly upon the customizable region. These thick-film components can then be either passively or actively trimmed to a wide range of values resulting in passive elements (e.g., resistors, inductors, capacitors). Active components such as bare silicon, or gallium arsenide, integrated circuits can be attached to the substrate (item 104 in FIG. 1) within the customizable region via wire, ribbon or mesh bonding. Surface mount components can be soldered to the customizable region directly. Indeed, customizable circuitry can utilize chip, wire and SMT assembly in any combination within the same customizable region. A variety of hybrid circuit elements can be stored in a data storage disk (item 330 in FIG. 3).

After the hybrid circuit is created, the back-side is then edited (block 480) to include any new PTH's that may be required for the hybrid circuit. Block 490 extends the ground plane before the design is finalized (item 490).

Figure 4C:
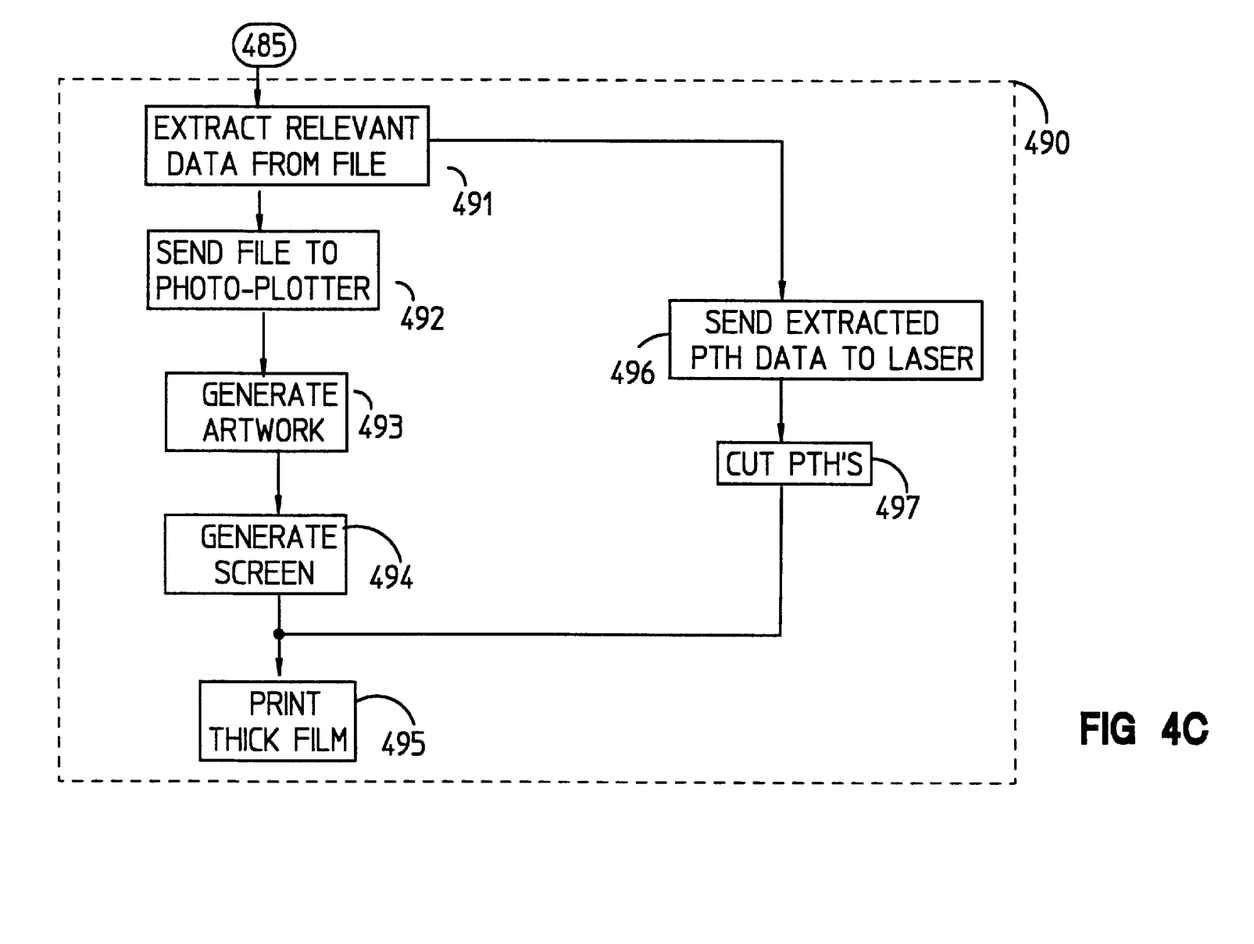

FIG. 4c shows a more detailed block diagram of block 490. After the RF hybrid design has been completed, block 491 extracts PM data and hybrid data from the file. Block 492 sends the file and relevant hybrid data to a photo plotter, such as the Orbeotech 5000. Artwork is generated (block 493) by the photo-plotter using the extracted hybrid file. Block 494 takes the artwork from block 493 and generates a screen for printing the thick-film (block 495). Concurrently, block 496 sends the extracted PTH data to a $CO_2$ laser subsystem which cuts the PTHs (block 497) required into the substrate. This modified substrate is then used by block 495 to print the thick-film circuit.

While the present invention has been illustrated and described in connection with the preferred embodiments, it is not to be limited to the particular structures shown. It should be understood by those skilled in the art that various changes and modifications may be made within the purview of the appended claims without departing from the true scope and spirit of the invention in its broader aspects. For example, another computer-aided design (CAD) tool may be used instead of the HP-EGS. A translator may be needed to convert the file generated by the engineer to be system-readable by the new CAD tool.

We claim:

1. A method for designing an RF modular hybrid circuit using a computer-aided design tool, the tool having a processing unit, a data library and memory, the method comprising the steps of:

(1) creating a file within memory, the file for storing a design of an RF modular hybrid circuit assembly;
   (2) initializing a back-side footprint, the back-side footprint being one of a plurality of generic footprints available from the data library;
   (3) adding instances of I/Os to the back-side footprint according to a protocol associated with the tool, the I/Os being one of a plurality of I/Os available from the data library;
   (4) initializing a front-side footprint, the front-side footprint being one of the plurality of generic footprints available from the data library;
   (5) combining the back-side footprint with the front-side footprint;
   (6) designing an initial layout of the RF modular hybrid circuit on the combined sides;
   (7) modifying the back-side footprint by placing instances of printed through holes in areas required by the initial layout of the RF modular hybrid circuit; and
   (8) finalizing the design of the RF modular hybrid circuit.

2. The method of claim 1, wherein step (3) comprises the further steps of:

(9) determining whether an RF transmission line is to be created;
   (10) adding, if an RF transmission line is created, an RF signal I/O to the back-side footprint; and
   (11) surrounding the RF signal I/O with two RF ground I/Os, thereby forming the RF transmission line.

3. A method for designing an RF modular hybrid circuit using a computer-aided design tool the tool having a processing unit, a data library and memory the method comprising the steps of (1) initializing a first circuit footprint by selecting one of a plurality of standardized footprints from the data library;
   (2) adding at least one I/O instance to the first circuit footprint the at least one I/O instance being one of a plurality of I/O instances being stored in the data library;
   (3) initializing a second circuit footprint;
   (4) combining first and second circuit footprints; and
   (5) designing the RF modular hybrid circuit, the RF modular hybrid circuit having at least one connection to the at least one I/O, instance.

4. The method of claim 3, wherein step (2) further comprises the steps of:

(6) determining whether an RF transmission line is to be constructed;
   (7) selecting an RF signal instance from the plurality of I/O instances being stored in the data library;
   (8) adding the selected RF signal instance to a first section of the first circuit footprint;
   (9) selecting two RF ground instances from the data library; and
   (10) adding the two RF ground instances to adjacent sections of the first section of the first circuit footprint.

* * * * *